(12) United States Patent
Chae et al.

(10) Patent No.: US 8,981,011 B2
(45) Date of Patent: Mar. 17, 2015

(54) OLEFIN-BASED IONOMER RESIN COMPOSITION

(71) Applicant: LG Chem, Ltd., Seoul (KR)

(72) Inventors: Hoon Chae, Daejeon (KR); Beom Doo Seo, Daejeon (KR); Choong Hoon Lee, Daejeon (KR); Sung Ho Choi, Seoul (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 14/057,825

(22) Filed: Oct. 18, 2013

(65) Prior Publication Data

US 2014/0045990 A1 Feb. 13, 2014

Related U.S. Application Data

(63) Continuation of application No. PCT/KR2012/003030, filed on Apr. 19, 2012.

(30) Foreign Application Priority Data

Apr. 19, 2011 (KR) .................. 10-2011-0036158
Apr. 29, 2011 (KR) .................. 10-2011-0040767
Apr. 19, 2012 (KR) .................. 10-2012-0041096

(51) Int. Cl.
| | | |
|---|---|---|
| C08F 255/02 | (2006.01) | |
| C08L 23/26 | (2006.01) | |
| H01L 31/048 | (2014.01) | |
| C09D 123/08 | (2006.01) | |
| C08L 51/06 | (2006.01) | |
| C08F 290/06 | (2006.01) | |
| C08F 8/44 | (2006.01) | |

(52) U.S. Cl.
CPC ............ *C08F 255/023* (2013.01); *C08L 23/26* (2013.01); *H01L 31/0481* (2013.01); *C09D 123/0876* (2013.01); *C08F 255/02* (2013.01); *C08L 51/06* (2013.01); *C08F 290/062* (2013.01); *C08F 8/44* (2013.01); *Y02E 10/50* (2013.01)
USPC .................. 525/327.4; 525/329.7; 525/330.3; 525/360; 525/370

(58) Field of Classification Search
USPC .................. 525/327.4, 329.7, 330.3, 360, 370
See application file for complete search history.

(56) References Cited

U.S. PATENT DOCUMENTS

| | | |
|---|---|---|
| 4,612,155 A | 9/1986 | Wong et al. |
| 4,906,690 A | 3/1990 | Hasenbein et al. |
| 5,604,033 A | 2/1997 | Arthurs et al. |
| 6,331,595 B1 | 12/2001 | Mitchell et al. |

FOREIGN PATENT DOCUMENTS

| | | |
|---|---|---|
| JP | 1-161079 | 6/1989 |
| JP | 2002-542363 A | 12/2002 |
| JP | 2006-32308 A | 2/2006 |
| KR | 10-2008-0078817 | 8/2008 |
| KR | 10-2009-00113375 | 10/2009 |
| WO | 00/63293 | 10/2000 |

*Primary Examiner* — Jeffrey Mullis
(74) *Attorney, Agent, or Firm* — McKenna Long & Aldridge, LLP

(57) ABSTRACT

The present application relates to an olefin-based ionomer resin composition, to an encapsulant, and to an optoelectronic device. The resin composition according to the present application may be used as an encapsulant for a variety of optoelectronic devices, and may exhibit superior adhesion to the substrates of the optoelectronic devices. In addition, according to the present application, an olefin-based ionomer resin composition, which can provide good workability and economic advantages in the manufacture of devices without negatively affecting components such as encapsulated optoelectronic elements or the wired electrodes of optoelectronic devices, may be provided.

18 Claims, 1 Drawing Sheet

OLEFIN-BASED IONOMER RESIN COMPOSITION

This application is a Continuation bypass application of International Application No. PCT/KR2012/003030, filed on Apr. 19, 2012, which claims priority to and the benefit of Korean Patent Application No. 10-2011-0036158, filed Apr. 19, 2011, Korean Patent Application No. 10-2011-0040767, filed on Apr. 29, 2011, and Korean Patent Application No. 10-2012-0041096, filed on Apr. 19, 2012, the entire contents of which are incorporated herein by reference.

TECHNICAL FIELD

Exemplary embodiments of the present application relate to an olefin-based ionomer resin composition and an encapsulant for an optoelectronic device.

BACKGROUND ART

An optoelectronic device such as a photovoltaic cell, a light emitting diode (LED), an organic light emitting diode (OLED), or the like may include an encapsulant that encapsulates a light emission or light sensing site of the device.

For example, a solar cell module may be typically manufactured by laminating a transparent front substrate which is a light-receiving substrate, an encapsulant, a photovoltaic element, an encapsulant, and a back sheet, and then thermally compressing the laminate while subjecting the laminate to vacuum suction.

As an encapsulant used in the solar cell module, an ethylene-vinyl acetate (EVA) resin is most commonly used in terms of processability, constructability, cost, and the like.

However, the EVA resin has low adhesion strength to a front substrate or back sheet, and thus, when a module is exposed to the outdoors for a long time, there is a problem in that delamination or peeling between layers easily occurs. Also, in the process of manufacturing a solar cell module using an encapsulant including an EVA resin, the EVA resin is thermally decomposed according to heat compression conditions, and thus acetic acid gas and the like may be generated. The above-described acetic acid gas has problems in that the gas aggravates the working environment, adversely affects a photovoltaic element, an electrode, or the like included in the solar cell module, and causes deterioration in the module, decrease in electricity generation efficiency, and the like.

Therefore, there is a continued need for an encapsulant for an optoelectronic device having improved long-term adhesion characteristics.

DISCLOSURE

Technical Problem

The present application is directed to providing an olefin-based ionomer resin composition and an encapsulant for an optoelectronic device.

Technical Solution

One aspect of the present application provides an olefin-based ionomer resin composition including a modified olefin copolymer. The modified olefin copolymer has two or more functional groups, and one of the functional groups is a carboxyl group. The modified olefin copolymer is a graft copolymer in which an ethylenically unsaturated silane compound as a first monomer and a monomer having an ethylenically unsaturated double bond as a second monomer are grafted to a polyolefin. A part or whole of the carboxyl group in the olefin-based ionomer resin composition has been neutralized with metal ions.

Another aspect of the present application provides an encapsulant for an optoelectronic device.

Advantageous Effects

Exemplary embodiments of the present application may provide a resin composition, which is used as an encapsulant of various optoelectronic devices and has excellent adhesion force to a substrate included in the device, and particularly improved long-term adhesion characteristics and heat resistance. In addition, it is possible to provide an olefin-based ionomer resin composition which may maintain excellent workability, economic efficiency, and the like in manufacturing the optoelectronic device without adversely affecting parts such as encapsulated optoelectronic elements, wiring electrodes, and the like in the device and a working environment.

Figure 1:
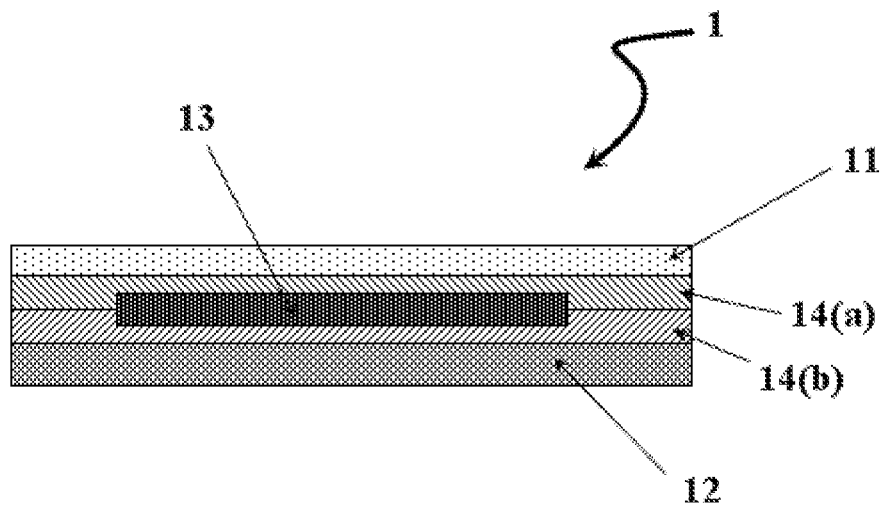
FIGS. 1 and 2 are cross-sectional views schematically illustrating a solar cell module which is an optoelectronic device according to an embodiment of the present application.

EXPLANATION OF REFERENCE NUMERALS AND SYMBOLS 1, 2: Solar cell module
11, 21: Light-receiving substrate
12, 22: Back sheet
13, 23: Photovoltaic element
14(a), 14(b), 24: Encapsulant

MODES OF THE INVENTION

Hereinafter, exemplary embodiments of the present application will be described in more detail. Also, in describing the present application, detailed description of a related known general configuration or function will be omitted.

An exemplary embodiment of the present application relates to an olefin-based ionomer resin composition, and an ionomer resin is generally a material in which an ionic group is contained in a non-polar polymer chain in a polymer including ions, and has an ionic group formed by neutralization of carboxylic acid contained in a non-polar main chain. At this time, the ionomer resin involves a morphological change by attraction between introduced ions, and exhibits physical properties different from the existing polymers. The olefin-based ionomer resin composition according to exemplary embodiment of the present application includes a modified olefin copolymer having two or more functional groups including a carboxyl group, and a part or whole of the carboxyl may be neutralized with metal ions, thereby imparting more improved adhesion force, mechanical properties, and heat resistance.

That is, in the olefin-based ionomer resin composition of the present application, a part or whole of a carboxyl group in the olefin-based ionomer resin composition has been neutralized with metal ions.

The olefin-based ionomer resin has an acid content of 0.5 to 10% by weight, or 0.5 to 5% by weight, and examples of the acid component include a carboxyl group, and the like provided by the second monomer. In order to have compatibility with a modified olefin-based copolymer, it is preferred that the carboxyl group be neutralized with a metal cation, that is, a metal cation which may interact with the carboxyl group.

In particular, 10% or more of the carboxyl group in the olefin-based ionomer resin composition may be neutralized with metal ions. When the metal ions are present in the above-described content, the olefin-based ionomer resin composition is preferable in terms of impact resistance.

The metal ions are monovalent to trivalent metal ions, and may be one or more selected from the group consisting of zinc ions, sodium ions, magnesium ions, calcium ions, lithium ions, potassium ions, tin ions, aluminum ions, barium ions, and tin ions.

The metal ions are neutralized in the olefin-based ionomer resin composition and form a physically cross-linked bond by forming an ionic bond between the metal ions and the carboxyl group, thereby improving the long-term durability of the resin. Therefore, compared to a resin including an olefin copolymer modified by only the first monomer, a hydrogen bond site is increased by neutralization of the second monomer which is additionally included and the metal ions, an ionic bond is provided, and thus adhesion strength and durability of the resin composition are improved. As an example, in the case of the encapsulant formed by the olefin-based ionomer resin composition of the present application, an ionic cluster is formed in the encapsulant by the metal ions, and thus durability is improved by the physically cross-linked bond while a hydrogen bond and a covalent bond are formed on the surface of the encapsulant, and thus the bond strength with other layers may be improved.

As described above, the olefin-based ionomer resin composition according to exemplary embodiments of the present application includes a modified olefin copolymer having two or more functional groups, and the functional group in the present application is not particularly limited as long as the functional group may produce a functional group capable of physically or chemically interacting with the substrate of the optoelectronic device.

According to an exemplary embodiment, the modified olefin copolymer includes two or more functional groups. For example, one of the functional groups is a hydrolyzable functional group provided by the ethylenically saturated silane compound as the first monomer, and may induce a physical or chemical interaction with various substrates included in the optoelectronic device, and for example, with a glass substrate, thereby improving adhesion therewith. The resin composition according to exemplary embodiments of the present application may additionally improve adhesion with the substrate by grafting the second monomer to a polyolefin such that the resin composition includes another functional group. In addition, in the resin composition according to exemplary embodiments of the present application, the carboxyl group in the modified olefin-based copolymer is neutralized with metal ions, and thus adhesion force between resins is further improved. Furthermore, a bond is formed through a hydrogen bond to an ionic bond with a hydroxyl group of the substrate, thereby improving adhesion force.

That is, when the resin composition according to exemplary embodiments of the present application is used as an encapsulant of an optoelectronic device including a glass substrate, and the like, the two or more functional groups may form a chemical covalent bond with a functional group such as a hydroxyl group, and the like present on the surface of the glass substrate through a physical bond such as a hydrogen bond; a condensation reaction, or the like, thereby improving adhesion therewith. In the present specification, the olefin copolymer having two or more functional groups as described above refers to "a modified olefin copolymer."

In one example, the hydrolyzable functional group included in the modified olefin copolymer by the first monomer may be a hydrolyzable silyl group. Also, as the second monomer which may impart another functional group, it is possible to use an acid anhydride-based monomer, (meth) acrylic acid, an alkyl(meth)acrylate, glycidyl(meth)acrylate, 2-hydroxyethyl(meth)acrylate, polyethylene glycol(meth) acrylate, vinyl sulfonic acid, a vinyl sulfonic acid alkyl ester, vinyl phosphoric acid, a vinyl phosphoric acid alkyl ester, or N-(hydroxymethyl)acrylamide. That is, the second monomer includes a polar group, and thus a physical bonding force with a substrate is increased by a hydrogen bond and a condensation reaction with the hydroxyl group on the surface and adhesion force between resins by the composition are increased, thereby improving adhesion therewith.

Specific examples of the second monomer include maleic acid anhydride, (meth)acrylic acid, methyl acrylate, methyl-methacrylate, glycidyl(meth)acrylate, 2-hydroxyethyl(meth) acrylate, polyethylene glycol(meth)acrylate, vinyl sulfonic acid, diethyl vinyl phosphate, and N-(hydroxymethyl)acrylamide, but are not limited thereto.

As an example, the modified olefin copolymer may be a graft copolymer in which a second monomer including another functional group is grafted to a silane modified olefin copolymer. In the present specification, the term "a hydrolyzable silyl group" refers to a silyl group having one or more hydrolyzable residues, and specifically, may be a functional group represented by the following Formula 1.

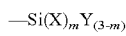

$$-\text{Si}(X)_m Y_{(3-m)} \qquad \text{[Formula 1]}$$

In Formula 1, X represents a hydrolyzable residue bound to a silicon atom, Y represents a non-hydrolyzable residue bound to a silicon atom, and m represents an integer of 1 to 3.

The hydrolyzable functional group (X) may be specifically a halogen atom, an alkoxy group, a phenoxy group, an acyloxy group, an alkylthio group, or an alkyleneoxythio group. In this case, examples of the halogen atom include chlorine (Cl), examples of the alkoxy group include an alkoxy group having 1 to 20 carbon atoms, 1 to 12 carbon atoms, 1 to 8 carbon atoms, or 1 to 4 carbon atoms, examples of the acyloxy group include an acyloxy group having 1 to 12 carbon atoms, examples of the alkylthio group include an alkylthio group having 1 to 12 carbon atoms, and examples of the alkyleneoxythio group include an alkyleneoxythio group having 1 to 12 carbon atoms. In one example, X in Formula 1 may be an alkoxy, and may be, specifically, an alkoxy group having 1 to 12 carbon atoms, 1 to 8 carbon atoms, or 1 to 4 carbon atoms. Examples of the aforementioned alkoxy group include a methoxy group, an ethoxy group, a propoxy group, an iso-propoxy group, or a butoxy group, and specifically a methoxy group, or an ethoxy group.

In addition, examples of the non-hydrolyzable residue of Formula 1 include hydrogen, an alkyl group, an aryl group, or an aralkyl group. Examples of the alkyl group include an alkyl group having 1 to 12 carbon atoms, 1 to 8 carbon atoms, or 1 to 4 carbon atoms. Also, the aryl group in Y may be an aryl group having 6 to 12 carbon atoms, for example, a phenyl group, and the aralkyl group may be an aralkyl group having 7 to 12 carbon atoms, for example, a benzyl group.

In addition, m in Formula 1 is an integer of 1 to 3, and may be, specifically, 3.

The modified olefin copolymer having two or more functional groups including the aforementioned hydrolyzable silyl group may be prepared by mixing a second monomer capable of imparting, for example, a polyolefin, an unsaturated silane compound, and another functional group, and grafting the second monomer capable of imparting the unsaturated silane compound and another functional group to a polyolefin in the presence of an appropriate radical initiator.

That is, the modified olefin copolymer in the present application may be a graft polymer in which an unsaturated silane compound represented by the following Formula 2 and the second monomer are grafted to a polyolefin.

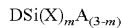 [Formula 2]

in Formula 2, D represents an alkenyl, and X, Y, and m are the same as those defined in Formula 1.

In Formula 2, the alkenyl group may be, for example, vinyl, allyl, propenyl, isopropenyl, butenyl, hexenyl, cyclohexenyl, octenyl, or the like, and preferably vinyl.

Specific examples of the unsaturated silane compound of Formula 2 include vinyl trimethoxy silane, vinyl triethoxy silane, vinyl tripropoxy silane, vinyl triisopropoxy silane, vinyl tributoxy silane, vinyl tripentoxy silane, vinyl triphenoxy silane, vinyl triacetoxy silane, or the like, and among them, vinyl trimethoxy silane, or vinyl triethoxy silane, but are not limited thereto.

Also, examples of an α-olefin which forms the polyolefin of the graft polymer include one or two or more of ethylene, propylene, 1-butene, isobutylene, 1-pentene, 2-methyl-1-butene, 3-methyl-1-butene, 1-hexene, 1-heptane, 1-octene, 1-nonene, or 1-decene, and may include 1-octene.

The modified olefin copolymer of the present application may include the aforementioned unsaturated silane compound in an amount of 0.1 to 5.0 parts by weight or 0.5 to 3.0 parts by weight, based on 100 parts by weight of the polyolefin.

In addition, the olefin-based ionomer resin composition according to exemplary embodiments of the present application may include the second monomer in a content of 0.5 to 10 parts by weight or 0.5 to 5 parts by weight based on 100 parts by weight of a solid content in the entire olefin-based ionomer resin composition. When the content of the second monomer is less than 0.5 parts by weight based on 100 parts by weight of a solid content in the entire olefin-based ionomer resin composition, it is difficult to improve adhesion strength, and when the content of the second monomer exceeds 10 parts by weight, self-curing caused by a side reaction between carboxyl groups by the second monomer occurs, and thus there is a subsequent risk of problems in processing, such as gel generation, and the like during processing using a sheet or film, such as an encapsulant and the like.

Therefore, the content of the second monomer included in the modified olefin copolymer may be 1 to 20 parts by weight based on 100 parts by weight of the polyolefin in the modified olefin copolymer, but may ultimately be 1 to 10 parts by weight based on 100 parts by weight of a solid content in the entire olefin-based ionomer resin composition.

For example, in an exemplary embodiment, the olefin-based ionomer resin composition includes one modified olefin copolymer, the content of the second monomer in the modified olefin copolymer may be 1 to 10 parts by weight based on 100 parts by weight of the polyolefin, and as a result, the content of the second monomer is 1 to 10 parts based on 100 parts by weight of a solid content in the entire olefin-based ionomer resin composition.

In another exemplary embodiment, the olefin-based ionomer resin composition includes one modified olefin copolymer and an olefin resin for addition, the content of the second monomer may be 1 to 20 parts by weight based on 100 parts by weight of the polyolefin, but due to the olefin resin for addition, the content of the second monomer may be 1 to 10 parts by weight based on 100 parts by weight of a solid content in the entire olefin-based ionomer resin composition.

That is, in the olefin-based ionomer resin composition according to exemplary embodiments of the present application, a desired physical property may be obtained by controlling the solid content in the entire olefin-based ionomer resin composition rather than the content of the second monomer in the modified olefin copolymer having two functional groups included in the olefin-based ionomer resin composition, that is, subsequently controlling the content of the second monomer of the modified olefin copolymer to be 1 to 10 parts by weight based on 100 parts by weight of a final product.

Unless particularly defined otherwise, the unit parts by weight in the present specification refers to a weight ratio. In this range, it is possible to maintain excellent adhesion to the resin composition, for example, adhesion to a glass substrate, and the like even at a cost lower than the cost at which a commercialized ionomer resin in the related art may be produced.

Also, since it is possible to prepare the modified olefin copolymer included in the olefin-based ionomer resin composition according to exemplary embodiments of the present application without using a solvent unlike in the related art, it is unnecessary to introduce, remove, and recover a solvent, and thus the modified olefin copolymer may be produced at a low cost and is also environmentally excellent.

The modified olefin copolymer may be a graft polymer in which the unsaturated silane compound and one or more of the second monomers are grafted to a polyolefin. The polyolefin may be polyethylene. Polyethylene is a polyolefin including ethylene as a main component in a polymerized form, and may be, specifically, a homopolymer, or a copolymer including ethylene or another co-monomer in a polymerized form.

The polyethylene may be, for example, one or two or more of a low-density polyethylene, an intermediate-density polyethylene, a high-density polyethylene, a very-low-density polyethylene, an ultra-low-density polyethylene, or a linear low-density polyethylene.

As an example, as a polyethylene in which an unsaturated silane compound and one or more of the second monomers are grafted, a polyethylene having many side chains may be used. In the case of the polyethylene having many side chains, grafting may be achieved more efficiently. Typically, a polyethylene having many side chains has a low density, while a polyethylene having a few side chains has a high density. That is, a low-density polyethylene may be used, and specifically, it is possible to use a polyethylene having a density of 0.85 g/cm$^3$ to 0.96 g/cm$^3$, or about 0.85 g/cm$^3$ to about 0.92 g/cm$^3$.

In addition, the polyethylene may have a melt flow rate (MFR) of about 0.1 g/10 min to about 50 g/10 min, about 0.3 g/10 min to about 30 g/10 min, or about 0.5 g/10 min to about 20 g/10 min at 190° C. When the polyethylene has an MFR in this range, for example, when the resin composition is used as an encapsulant of optoelectronic device, excellent formability, adhesion, and the like may be exhibited.

In another exemplary embodiment, the polyolefin is prepared in the presence of a catalyst, and includes an ethylene-octene copolymer having a density of 0.857 g/cm$^3$ to 0.910 g/cm$^3$. When a very-low-density ethylene-octene copolymer is prepared using a metallocene catalyst, the distribution of octene is uniform, and the ethylene-octene copolymer has a low density and a low melting point, and thus excellent sealing strength may be secured during the manufacture of an encapsulant.

Specifically, the ethylene-octene copolymer satisfies the following equation.

1) Molecular weight distribution: Mw/Mn<3.5
2) The product of a reactivity ratio ($r_e$) of ethylene to a catalyst and a reactivity ($r_o$) of octene to the catalyst is 0.5 to 0.8, and
3) The relationship equation between the content α (mol %) of octene in the ethylene-octene copolymer and the density of the ethylene-octene copolymer: 0.9190−0.0043α<density<0.9205−0.0040α

In the ethylene-octene copolymer, the Mw/Mn value, which is a polydispersity index (PDI) showing the molecular weight distribution, is 3.5 or less, and the product of the reactivity ratio ($r_e$) of ethylene to a catalyst and the reactivity ($r_o$) of octene to the catalyst is 0.5 to 0.8.

The product of the reactivity ratio ($r_e$) of ethylene to the catalyst and the reactivity ($r_o$) of octene to the catalyst, that is, $r_e \times r_o$, shows the distribution of monomers in the polymer main chain in the ethylene-octene copolymer. The $r_e$ and $r_o$ values, which are reactivity ratios of the monomer to the catalyst, may be interpreted by Randall's method using $^{13}$C NMR spectrum, and may be calculated as follows by Kakugo's method [Macromolecules 1982, 15, 1150].

$$r_e = \frac{2EEE + EEC}{(2ECE + CCE)X},$$

$$r_o = \frac{(2CCC + CCE)X}{2ECE + CCE}$$

Here, E is ethylene, C is octene which is a co-monomer, and X is a mole fraction of ethylene and octene which are monomers injected into a reactor. Also, EEE is a mole % of the sequence arrangement of ethylene-ethylene-ethylene in the ethylene-octene copolymer, EEC is a mole % of the sequence arrangement of ethylene-ethylene-octene in the ethylene-octene copolymer, ECE is a mole % of the sequence arrangement of ethylene-octene-ethylene in the ethylene-octene copolymer, CCE is a mole % of the sequence arrangement of octene-octene-ethylene in the ethylene-octene copolymer, and CCC is a mole % of the sequence arrangement of octene-octene-octene in the ethylene-octene copolymer.

The $r_e$ and $r_o$ values, which are reactivity ratios of the monomer to the catalyst, are means by which the microstructure of the copolymer can be conceptualized through the amount of the monomers introduced into a reactor and $^{13}$C NMR interpretation.

The melting point is high when the distribution of the co-monomer shows a block distribution ($r_e \times r_c > 1$), the melting point is low when the distribution of the co-monomer shows a uniform distribution (alternate distribution, $r_e \times r_c < 1$), and the melting point is located therebetween when the distribution of the co-monomer shows a random distribution (arbitrary distribution, $r_e \times r_c = 1$).

In the ethylene-octene copolymer, the product of the reactivity ratio ($r_e$) of ethylene to the catalyst and the reactivity ($r_o$) of octene to the catalyst is 0.5 to 0.8, and thus octene, which is a co-monomer, may form a uniform distribution in the copolymer.

In addition, the density of the ethylene-octene copolymer and the content (a, mol %) of octene in the ethylene-octene copolymer satisfy 0.9190−0.0043α<density<0.9205−0.0040α. Therefore, it is possible to show a density much lower than that of the existing ethylene-octene copolymer in the same co-monomer content. Also, it is possible to minimize the content of the co-monomer used in the preparation process of the aforementioned ethylene-octene copolymer, and thus a cost reduction effect may also be obtained. For example, the ethylene-octene copolymer may have a density of 0.857 to 0.91 g/cm³, 0.859 to 0.91 g/cm³, or 0.861 to 0.91 g/cm³.

The ethylene-octene copolymer may be prepared using a catalyst composition including a metallocene catalyst. The catalyst composition may include a transition metal compound, a promoter, and the like.

The content of octene in the ethylene-octene copolymer may be 2 to 20 mol %, 3 to 20 mol %, or 3 to 17 mol %.

When a polyolefin is used as described above, an ethylene-octene copolymer that may have a low melting point is used when an encapsulant is manufactured using an olefin-based ionomer resin composition, and thus a low temperature sealing phenomenon may occur, and sealing strength may be excellent.

When a modified olefin copolymer is prepared in the resin composition according to exemplary embodiments of the present application, a radical initiator may be used. The radical initiator may serve to graft the first monomer, for example, an unsaturated silane compound and the second monomer, for example, acrylic acid, and the like to a polyolefin.

Therefore, adhesion may be improved by efficiently controlling physical properties of the resin composition or encapsulant according to the purpose thereof to induce a physical or chemical interaction with various substrates included in an optoelectronic device, for example, a glass substrate.

The specific type of radical initiator in the present application is not particularly limited as long as the radical initiator may initiate the radical polymerization, and examples thereof include one or two or more of an organic peroxide, a hydroperoxide, an azo compound, or the like.

Examples of the radical initiator include one or more selected from the group consisting of dialkyl peroxides such as t-butylcumyl peroxide, di-t-butyl peroxide, di-cumyl peroxide, 2,5-dimethyl-2,5-di(t-butylperoxy)hexane, 2,5-dimethyl-2,5-di(t-butylperoxy)-3-hexyne, and the like, hydroperoxides such as cumen hydroperoxide, diisopropyl benzene hydroperoxide, 2,5-dimethyl-2,5-di(hydroperoxy)hexane, t-butyl hydroperoxide, and the like, diacyl peroxides such as bis-3,5,5-trimethylhexanoyl peroxide, octanoyl peroxide, benzoyl peroxide, o-methylbenzoyl peroxide, 2,4-dichlorobenzoyl peroxide, and the like, peroxy esters such as t-butylperoxy isobutylate, t-butylperoxy acetate, t-butylperoxy-2-ethylhexanoate, t-butylperoxy pyvalate, t-butylperoxy octoate, t-butylperoxyisopropyl carbonate, t-butylperoxy benzoate, di-t-butylperoxy phthalate, 2,5-dimethyl-2,5-di (benzoylperoxy)hexane, 2,5-dimethyl-2,5-di(benzoylperoxy)-3-hexyne, and the like, ketone peroxides, such as methyl ethyl ketone peroxide, cyclohexanone peroxide, and the like, lauroyl peroxide, and an azo compound such as azobisisobutyronitrile, azobis(2,4-dimethylvaleronitrile), and the like.

The radical initiator may be used in an amount of 0.5 to 20 parts by weight, or 1 to 10 parts by weight based on 100 parts by weight of the first monomer and the second monomer.

In the weight ratio, adhesion to a substrate may be enhanced and the activity of an additive such as a UV stabilizer, and the like included in the resin composition may be maintained at an excellent level by efficiently controlling physical properties of the entire resin composition.

The resin composition according to exemplary embodiments of the present application may additionally include an olefin resin for addition, if necessary. The specific type of available olefin resin for addition is not particularly limited. For example, as the olefin resin for addition, a polyethylene may be used, and specifically, it is possible to use a polyethylene pertaining to the same class of a polyethylene exemplified as the polyethylene in which the unsaturated silane compound or the second monomer may be grafted.

The content of the olefin resin for addition in the resin composition is not particularly limited, and may be selected in consideration of a desired physical property. For example, the olefin resin for addition may be included in a range from 0.01 parts by weight to 3,000 parts by weight, or from 90 parts by weight to 1,000 parts by weight based on 100 parts by weight of the modified olefin copolymer.

The resin composition according to exemplary embodiments of the present application may additionally include one or two or more additives selected from a light stabilizer, a UV absorber, a heat stabilizer, and the like, if necessary.

The light stabilizer may serve to prevent photooxidation of the olefin copolymer by capturing an active species that initiates deterioration by light of the olefin copolymer. The type of available light stabilizer is not particularly limited, and it is possible to use, for example, a known compound such as a hindered amine-based compound or a hindered piperidino-based compound, or the like.

In addition, the UV absorber may serve to prevent the active species in the olefin copolymer, which initiates deterioration by light from being excited by absorbing UV rays from the solar light and the like according to the use of the resin composition to convert the absorbed UV rays into harmless heat energy in the molecule. The specific type of available UV absorber is not particularly limited, and for example, a benzophenone-based UV absorber, a benzotriazole-based UV absorber, an acrylnitrile-based UV absorber, a metal complex salt-based UV absorber, a hindered amine-based UV absorber, an inorganic UV absorber such as ultrafine particulate titanium oxide or ultrafine particulate zinc oxide, and the like may be used alone or in combination of two or more thereof.

Also, examples of an available heat stabilizer include a phosphorus-based stabilizer such as tris(2,4-di-tert-butylphenyl)phosphite, bis[2,4-bis(1,1-dimethylethyl)-6-methylphenyl]ethyl ester phosphorous acid, tetrakis(2,4-di-tert-butylphenyl) [1,1-biphenyl]-4,4'-diylbisphosphonate, bis(2,4-di-tert-butylphenyl)pentaerythritoldiphosphite, and the like; and a lactone-based stabilizer such as reaction products of 8-hydroxy-5,7-di-tert-butyl-furan-2-one and o-xylene, and the like, and these may be used alone or in combination of two or more thereof.

The content of the light stabilizer, UV absorber, and/or heat stabilizer is not particularly limited. That is, the content of the additives may be appropriately selected in consideration of the use of the resin composition, the shape or density of the additive, and the like, and may be appropriately controlled in a range from 0.01 to 5 parts by weight typically based on 100 parts by weight of the entire solid content of the resin composition.

The resin composition according to exemplary embodiments of the present application may additionally include various additives known in the art appropriately according to the use to which resin components are applied in addition to the components.

Other exemplary embodiments of the present application relate to an encapsulant for an optoelectronic device including the olefin-based ionomer resin composition.

In the encapsulant, the olefin-based ionomer resin composition may also be included in a state in which each component is uniformly mixed as it is, or in a state in which each component is molded by various molding methods such as heat melt extrusion, T die molding, and the like.

The shape of the encapsulant is not particularly limited, and may be, for example, in a sheet or film phase. In this case, the film thickness of the encapsulant may be controlled to about 10 μm to about 2,000 μm, or about 100 μm to about 1,250 μm in consideration of supporting efficiency and breakage possibility of the element, light weight or workability of the device, and the like. However, the film thickness of the encapsulant may be changed according to the specific use applied.

A method of manufacturing the encapsulant using the olefin-based ionomer resin composition according to exemplary embodiments of the present application is not particularly limited. For example, the encapsulant may be manufactured using a method of performing extrusion processing by pelletizing the olefin-based ionomer resin composition, a basic hydrolysis catalyst and/or a necessary additive, and heat-melting the pellet, a method of introducing components such as an olefin-based ionomer resin composition, a catalyst, and the like into a hopper of an extruder, mixing the components therein, and heat-melting the mixture in a cylinder, or the like. After the aforementioned heat melting process, the encapsulant may be manufactured in a sheet or film shape using a typical process such as a T die process, and the like.

Still other exemplary embodiments of the present application relate to an optoelectronic device including an optoelectronic element encapsulated by the encapsulant derived from the above-described olefin-based ionomer resin composition.

The encapsulated optoelectronic element may be, for example, a light emission or light sensing site, such as a photovoltaic cell, a light emitting diode, an organic light emitting diode, or the like.

A method of encapsulating an optoelectronic element using the specific structure or resin composition of the optoelectronic device is not particularly limited, and may be applied to achieve the purpose according to the corresponding device.

Figure 2:
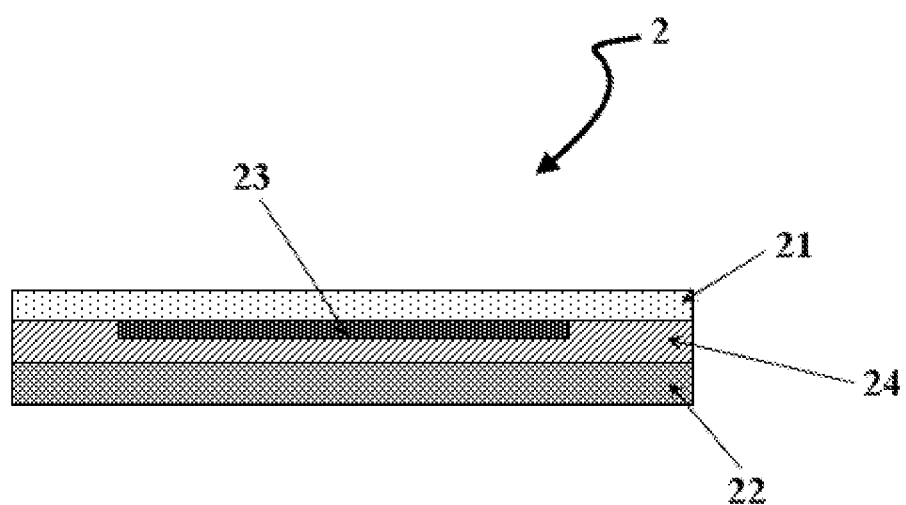

For example, when the optoelectronic device is a photovoltaic cell, as illustrated in FIG. 1 or 2, the optoelectronic device may be a solar cell module including a photovoltaic element 13 and 23 encapsulated by a light-receiving substrate 11 and 21, a back sheet 12 and 22, and an encapsulant 14(a), 14(b), and 24 between the light-receiving substrate 11 and 21 and the back sheet 12 and 22, and in this case, the encapsulant may be manufactured from the olefin-based ionomer resin composition according to exemplary embodiments of the present application.

The aforementioned solar cell module may be manufactured by a typical molding method such as a lamination method of laminating a light-receiving substrate, an encapsulant, a photovoltaic element, a back sheet, and the like, and subsequently thermally compressing the laminate while integrally subjecting the laminate to vacuum suction, and the like. In this case, the process condition of the lamination method is not particularly limited, and the process may be performed typically at a temperature of 90° C. to 230° C. or 110° C. to 190° C. for 5 min to 60 min, or 8 min to 40 min.

In the case of the olefin-based ionomer resin composition of the present application, during the aforementioned module process, two or more functional groups may be included in the resin composition as they are or may be modified to form a hydrogen bond with a residue such as a hydroxyl group and the like on the glass substrate, or a chemical covalent bond by condensation, thereby exhibiting high adhesion to the substrate. In addition, an ionic bond may be imparted even by neutralized metals in the ionomer resin composition.

In the above, the specific type of available light-receiving substrate, back sheet, photovoltaic element, and the like is not particularly limited. For example, the light-receiving substrate may be a typical plate glass; or a transparent complex sheet in which glass, a fluorine-based resin sheet, a weatherable film, and a barrier film are laminated, and a complex sheet in which a metal such as aluminum and the like, a fluorine-based resin sheet, a weatherable film, a barrier film, and the like are laminated as a back sheet. Also, the photovoltaic element may be, for example, a silicon wafer-based active layer, or a thin film active layer formed by chemical vapor deposition (CVD), and the like.

Hereinafter, Examples according to the present application and Comparative Examples not according to the present application will be described in more detail, but the scope of the present application is not limited by the following Examples.

Example 1

Manufacture of Encapsulant 2 parts by weight of vinyl trimethoxy silane (VTMS) and 20 parts by weight of acrylic acid were grafted to 98 parts by weight of a polyethylene having a density of 0.885 g/cm³ and an MFR of 2 g/10 min at 190° C. (octene content: 8.5 mol %, Mw=89,000, Mn=34,230, and Mw/Mn=2.6) using 10 parts by weight of 2,5-dimethyl-2,5-di(tert-butylperoxy)hexane, 20 parts by weight of a modified ionomer resin in which a part of carboxyl groups were neutralized by 8 parts by weight of zinc metal ions ($Zn^{2+}$), 70 parts by weight of a linear low-density polyethylene having a density of 0.898 g/cm³ and an MFR of 2 g/10 min at 190° C., and 10 parts by weight of a separately prepared master batch (pelletized by mixing 3 parts by weight of a hindered amine-based light stabilizer, 2 parts by weight of a benzophenone-based UV absorber, and 2 parts by weight of a phosphorus-based heat stabilizer with 100 parts by weight of the linear low-density polyethylene, then melting the mixture, and processing the mixture) were mixed, and the mixture was introduced into a hopper of a film molding device having a ϕ25 mm extruder and a 300 mm wide T die to film-form a sheet-shaped encapsulant having a thickness of about 400 μm at an extrusion temperature of 230° C. and a blowing speed of 3 m/min (content in the sheet-shaped encapsulant: silane 0.4% by weight and acid content 4% by weight, and degree of neutralization: 40%).

Manufacture of Photovoltaic Cell Module

A plate glass (thickness: about 8 mm), the encapsulant having a thickness of 400 μm as manufactured above, a crystalline silicon wafer photovoltaic element, the encapsulant having a thickness of 400 μm as manufactured above, and a back sheet (a laminated sheet of a polyvinyl fluoride resin sheet having a thickness of 38 μm, an aluminum foil having a thickness of 30 μm, and a polyvinyl fluoride resin sheet having a thickness of 38 μm) were laminated in this order, and the laminate was compressed at 150° C. in a vacuum laminator for manufacturing a photovoltaic cell for 15 min to manufacture a photovoltaic cell module.

Example 2

An encapsulant and a photovoltaic cell module were manufactured in accordance with the method in Example 1, except that 2.5 parts by weight of glycidyl acetate was used as the second monomer instead of acrylic acid and the content of zinc metal ions was controlled to maintain the degree of neutralization at 40% when the modified polyethylene ionomer resin was prepared (content in the sheet-shaped encapsulant: silane 0.4% by weight and acid content 0.5% by weight, and degree of neutralization: 40%).

Example 3

An encapsulant and a photovoltaic cell module were manufactured in accordance with the method in Example 1, except that sodium ions ($Na^+$) were used as the metal ions (content in the sheet-shaped encapsulant: silane 0.4% by weight and acid content 4% by weight, and degree of neutralization: 40%).

Example 4

An encapsulant and a photovoltaic cell module were manufactured in accordance with the method in Example 1, except that 5 parts by weight of acrylic acid was used as the second monomer and the content of zinc metal ions was controlled to maintain the degree of neutralization at 40% when the modified polyethylene ionomer resin was prepared, and 40 parts by weight of the modified polyethylene ionomer resin, 50 parts by weight of the linear low-density polyethylene, and 10 parts by weight of the master batch were used when the encapsulant was manufactured (content in the sheet-shaped encapsulant: silane 0.8% by weight and acid content 2% by weight, and degree of neutralization: 40%).

Example 5

An encapsulant and a photovoltaic cell module were manufactured in accordance with the method in Example 1, except that 5.6 parts by weight of acrylic acid was used as the second monomer and the content of zinc metal ions was controlled to maintain the degree of neutralization at 40% when the modified polyethylene ionomer resin was prepared, and 90 parts by weight of the modified polyethylene ionomer resin and 10 parts by weight of the maser batch were used without a separate linear low-density polyethylene when the encapsulant was manufactured (content in the sheet-shaped encapsulant: silane 1.8% by weight and acid content 5.0% by weight, and degree of neutralization: 40%).

Comparative Example 1

An encapsulant and a photovoltaic cell module were manufactured in accordance with the method in Example 1, except that the metal ions were not used (content in the sheet-shaped encapsulant: silane 0.4% by weight and acid content 4% by weight, and degree of neutralization: 0%).

Comparative Example 2

An encapsulant and a photovoltaic cell module were manufactured in accordance with the method in Example 1, except that the second monomer was not used (content in the sheet-shaped encapsulant: silane 0.4% by weight, and degree of neutralization: 0%).

Comparative Example 3

An encapsulant and a photovoltaic cell module were manufactured in accordance with the method in Example 1, except that a styrene monomer was used as the second monomer (content in the sheet-shaped encapsulant: silane 0.4% by weight and benzene content 4% by weight, and degree of neutralization: 0%).

Comparative Example 4

An encapsulant and a photovoltaic module were manufactured in accordance with the method in Example 1, except that 0.5 parts by weight of acrylic acid was used as the second monomer instead of acrylic acid and the content of zinc metal ions was controlled to maintain the degree of neutralization at 40% when the modified polyethylene ionomer resin was prepared (content in the sheet-shaped encapsulant: silane 0.4% by weight and acid content 0.1% by weight, and degree of neutralization: 40%).

Comparative Example 5

An encapsulant and a photovoltaic cell module were manufactured in accordance with the method in Example 1, except that 20 parts by weight of acrylic acid was used as the second monomer and the content of zinc metal ions was controlled to maintain the degree of neutralization at 40% when the modified polyethylene ionomer resin was prepared, and 75 parts by weight of the modified polyethylene ionomer resin, 15 parts by weight of the linear low-density polyethylene, and 10 parts by weight of the master batch were used when the encapsulant was manufactured (content in the sheet-shaped encapsulant: silane 1.5% by weight and acid content 15% by weight, and degree of neutralization: 40%).

Comparative Example 6

An encapsulant and a photovoltaic cell module were manufactured in accordance with the method in Example 1, except that the first monomer was not used (content in the sheet-shaped encapsulant: acid content 4% by weight, and degree of neutralization: 0%).

Comparative Example 7

An encapsulant and a photovoltaic cell module were manufactured in accordance with the method in Example 1, except that aminosilane was used as the first monomer instead of VTMS (content in the sheet-shaped encapsulant: aminosilane 0.4% by weight and acrylic acid 4% by weight, and degree of neutralization: 0%).

Comparative Example 8

An encapsulant and a photovoltaic cell module were manufactured in accordance with the method in Example 1, except that a polyethylene having a density of 0.94 g/cm$^3$ and an MFR of 2 g/10 min at 190° C. was used when the modified polyethylene ionomer resin was prepared, and a linear low-density polyethylene having a density of 0.94 g/cm$^3$ was used as an olefin resin for addition instead of a linear low-density polyethylene having a density of 0.898 g/cm$^3$ when the encapsulant was manufactured.

TABLE 1

| | Modified polyethylene ionomer resin Acid content | Encapsulant Silane content | Encapsulant Acid content | Encapsulant Degree of neutralization |
|---|---|---|---|---|
| Example 1 | 20 parts by weight | 0.4% by weight | 4% by weight | 40% |
| Example 2 | 2.5 parts by weight | 0.4% by weight | 0.5% by weight | 40% |
| Example 3 | 20 parts by weight | 0.4% by weight | 4% by weight | 40% |
| Example 4 | 5 parts by weight | 0.8% by weight | 2% by weight | 40% |

TABLE 1-continued

| | Modified polyethylene ionomer resin Acid content | Encapsulant Silane content | Encapsulant Acid content | Encapsulant Degree of neutralization |
|---|---|---|---|---|
| Example 5 | 5.6 parts by weight | 1.8% by weight | 5% by weight | 40% |
| Comparative Example 1 | 20 parts by weight | 0.4% by weight | 4% by weight | 0 |
| Comparative Example 2 | 0 | 0.4% by weight | 0 | 0 |
| Comparative Example 3 | 20 parts by weight | 0.4% by weight | 0 | 0 |
| Comparative Example 4 | 0.5 parts by weight | 0.4% by weight | 0.1% by weight | 40% |
| Comparative Example 5 | 20 parts by weight | 1.5% by weight | 15% by weight | 40% |
| Comparative Example 6 | 20 parts by weight | 0 | 4% by weight | 40% |
| Comparative Example 7 | 20 parts by weight | 0.4% by weight | 4% by weight | 40% |
| Comparative Example 8 | 20 parts by weight | 0.4% by weight | 4% by weight | 40% |

1. Measurement of Adhesion Strength to Glass (Evaluation of Long-Term Adhesion Characteristics)

The photovoltaic cell modules manufactured in Examples 1 to 5 and Comparative Examples 1 to 8 were adhered and laminated, and then allowed to stand at 85° C. and a humidity of 85% for 1,000 hours or more, and maintenance of the adhesion force was tested. The % of the adhesion force that had been lost compared to the initial adhesion force was quantified, and the values are shown in the following Table 2.

In addition, durability was measured by repeating 200 cycles of the experiments at −40° C. and 85° C., and then evaluating the adhesion force, and then the values are shown in the following Table 2.

2. Evaluation of Module Moldability

The moldability of the photovoltaic cell modules manufactured in Examples 1 to 5 and Comparative Examples 1 to 8 was evaluated. The decision criteria were set with respect to whether there was release, peeling, bubbling, shrinkage, and the like in the outward appearance through a visual check, and the arrangement state of the solar cell silicon cell was checked.

TABLE 2

| | Adhesion strength to glass (N/15 mm) | | | |
|---|---|---|---|---|
| | Initial adhesion force | After 2,000 hr | After 200 cycles | Module moldability |
| Example 1 | 350 | 330 | 331 | Good |
| Example 2 | 332 | 328 | 312 | Good |
| Example 3 | 310 | 300 | 280 | Good |
| Example 4 | 300 | 150 | 179 | Good |
| Example 5 | 370 | 341 | 350 | Good |
| Comparative Example 1 | 350 | 102 | 115 | Good |
| Comparative Example 2 | 150 | 30 | 70 | Good |
| Comparative Example 3 | 100 | 20 | 30 | Defective |
| Comparative Example 4 | 155 | 35 | 80 | Good |
| Comparative Example 5 | 390 | 372 | 374 | Defective |
| Comparative Example 6 | 180 | 83 | 102 | Good |
| Comparative Example 7 | 120 | 28 | 15 | Defective |

TABLE 2-continued

| | Adhesion strength to glass (N/15 mm) | | | |
|---|---|---|---|---|
| | Initial adhesion force | After 2,000 hr | After 200 cycles | Module moldability |
| Comparative Example 8 | 200 | 180 | 30 | Defective |

As shown in Table 2, when an olefin resin including both the ethylenically unsaturated silane compound and the second monomer has the ethylenically unsaturated double bond, and in particular, when the content of the second monomer in the final encapsulant sheet is 10% by weight or less (Examples 1 to 5), it can be confirmed that fairly good adhesion characteristics and module moldability are exhibited.

However, in the case of a non-ionomer resin composition in which no metal ions were used (Comparative Example 1), there was no big difference in initial adhesion characteristics, but it was confirmed that the long-term durability deteriorated due to the absence of metal ions. Also, even when the second monomer was not used (Comparative Example 2), it was confirmed that adhesion characteristics deteriorated, and when a functional group was not sufficiently provided, such as when a styrene monomer was used as the second monomer (Comparative Example 3) or the first monomer was not used (Comparative Example 6), and aminosilane was used as the first monomer instead of an ethylenically unsaturated silane (Comparative Example 7), it was confirmed that defects occurred.

In addition, even when the content of the second monomer was less than a predetermined range (Comparative Example 4), a functional group was not sufficiently provided, and thus it was confirmed that adhesion characteristics deteriorated.

Conversely, when the content of the second monomer was more than a predetermined range (Comparative Example 5), adhesion characteristics were fairly good whereas the module molding was defective. This is because gel was generated during the module molding.

While the invention has been shown and described with reference to certain exemplary embodiments thereof, it will be understood by those skilled in the art that various changes in form and details may be made therein without departing from the spirit and scope of the invention as defined by the appended claims. Therefore, the true technical scope of the present application should be defined by the technical spirit of the appended claims.

The invention claimed is:

1. An olefin-based ionomer resin composition comprising: a modified olefin copolymer having two or more functional groups which includes a carboxyl group,
wherein the modified olefin copolymer is a graft copolymer in which an ethylenically unsaturated silane compound as a first monomer and a monomer having an ethylenically unsaturated double bond as a second monomer are grafted to a polyolefin having a density of 0.85 g/cm³ to 0.96 g/cm³, and a part or whole of the carboxyl group in the olefin-based ionomer resin composition is neutralized with metal ions.

2. The olefin-based ionomer resin composition of claim 1, wherein the second monomer is an acid anhydride-based monomer, (meth)acrylic acid, an alkyl(meth)acrylate, glycidyl(meth)acrylate, 2-hydroxyethyl(meth)acrylate, polyethylene glycol(meth)acrylate, vinyl sulfonic acid, a vinyl sulfonic acid alkyl ester, vinyl phosphoric acid, a vinyl phosphoric acid alkyl ester, or N-(hydroxymethyl)acrylamide.

3. The olefin-based ionomer resin composition of claim 2, wherein the second monomer is maleic acid anhydride, (meth)acrylic acid, methyl(meth)acrylate, glycidyl(meth)acrylate, 2-hydroxyethyl(meth)acrylate, polyethylene glycol (meth)acrylate, vinyl sulfonic acid, diethyl vinyl phosphate, or N-(hydroxymethyl)acrylamide.

4. The olefin-based ionomer resin composition of claim 1, wherein a content of the second monomer is 0.5 to 10 parts by weight based on 100 parts by weight of a solid content in the olefin-based ionomer resin composition.

5. The olefin-based ionomer resin composition of claim 1, wherein 10% or more of the carboxyl group in the olefin-based ionomer resin composition is neutralized with metal ions.

6. The olefin-based ionomer resin composition of claim 1, wherein the metal ions are one or more selected from the group consisting of zinc ions, sodium ions, magnesium ions, calcium ions, lithium ions, potassium ions, tin ions, aluminum ions, barium ions, and tin ions.

7. The olefin-based ionomer resin composition of claim 1, wherein the modified olefin copolymer is a graft copolymer in which the second monomer is grafted to a silane modified olefin copolymer having a silyl group represented by the following Formula 1:

$$-Si(X)_m Y_{(3-m)} \quad \text{[Formula 1]}$$

in Formula 1, X represents a halogen atom, an alkoxy group, a phenoxy group, an acyloxy group, an alkylthio group, or an alkyleneoxythio group, Y represents hydrogen, an alkyl group, an aryl group, or an aralkyl group, and m represents an integer of 1 to 3.

8. The olefin-based ionomer resin composition of claim 7, wherein X represents an alkoxy group having 1 to 12 carbon atoms.

9. The olefin-based ionomer resin composition of claim 1, wherein the modified olefin copolymer is a graft copolymer in which an unsaturated silane compound of the following Formula 2 and the second monomer are grafted to a polyolefin:

$$DSi(X)_m Y_{(3-m)} \quad \text{[Formula 2]}$$

in Formula 2, D represents an alkenyl group, and X represents a halogen atom, an alkoxy group, a phenoxy group, an acyloxy group, an alkylthio group, or an alkyleneoxythio group, Y represents hydrogen, an alkyl group, an aryl group, or an aralkyl group, and m represents an integer of 1 to 3.

10. The olefin-based ionomer resin composition of claim 9, wherein the unsaturated silane compound of Formula 2 is vinyl trimethoxy silane, vinyl triethoxy silane, vinyl tripropoxy silane, vinyl triisopropoxy silane, vinyl tributoxy silane, vinyl tripentoxy silane, vinyl triphenoxy silane, or vinyl triacetoxy silane.

11. The olefin-based ionomer resin composition of claim 1, wherein the polyolefin is prepared in the presence of a catalyst, and comprises an ethylene-octene copolymer having a density of 0.857 g/cm³ to 0.910 g/cm³, and the ethylene-octene copolymer satisfies the following Formula:

1) molecular weight distribution: Mw/Mn<3.5,

2) $r_e \times r_o$ is 0.5 to 0.8, and 3) a relationship equation between the content a (mol %) of octene in the ethylene-octene copolymer and the density of the ethylene-octene copolymer: $0.9190 - 0.0043\alpha < \text{density} < 0.9205 - 0.0040\alpha$, wherein $r_e$ is a reactivity ratio of ethylene to the catalyst and $r_o$ is a reactivity ratio of ethylene to the catalyst, both are calculated by the following Kakugo's method, $$r_e = \frac{2EEE + EEC}{(2ECE + CCE)X}, \quad r_o = \frac{(2CCC + CCE)X}{2ECE + CCE},$$

where, E is ethylene,
C is octene which is a co-monomer,
X is a mole fraction of ethylene and octene which are monomers injected into a reactor,
EEE is a mole % of the sequence arrangement of ethylene-ethylene-ethylene in the ethylene-octene copolymer,
EEC is a mole % of the sequence arrangement of ethylene-ethylene-octene in the ethylene-octene copolymer,
ECE is a mole % of the sequence arrangement of ethylene-octene-ethylene in the ethylene-octene copolymer,
CCE is a mole % of the sequence arrangement of octene-octene-ethylene in the ethylene-octene copolymer, and
CCC is a mole % of the sequence arrangement of octene-octene-octene in the ethylene-octene copolymer.

12. The olefin-based ionomer resin composition of claim 1, wherein in the modified olefin copolymer is a graft copolymer in which the first monomer and the second monomer are grafted to the polyolefin by a radical initiator.

13. The olefin-based ionomer resin composition of claim 12, wherein the radical initiator is an organic peroxide, a hydroperoxide, or an azo compound.

14. The olefin-based ionomer resin composition of claim 12, wherein the radical initiator is one or more selected from the group consisting of t-butylcumyl peroxide, di-t-butyl peroxide, di-cumyl peroxide, 2,5-dimethyl-2,5-di(t-butylperoxy)hexane, 2,5-dimethyl-2,5-di(t-peroxy)hexane, cumene hydroperoxide, diisopropyl benzene hydroperoxide, 2,5-dimethyl-2,5-di(hydroperoxy)hexane, t-butyl hydroperoxide, bis-3,5,5-trimethylhexanoyl peroxide, octanoyl peroxide, benzoyl peroxide, o-methylbenzoyl peroxide, 2,4-dichlorobenzoyl peroxide, t-butylperoxy isobutylate, t-butylperoxy acetate, t-butylperoxy-2-ethylhexanoate, t-butylperoxy pivalate, t-butylperoxy octoate, t-butylperoxyisopropyl carbonate, t-butylperoxy benzoate, di-t-butylperoxy phthalate, 2,5-dimethyl-2,5-di(benzoylperoxy)hexane, 2,5-dimethyl-2,5-di(benzoylperoxy)hexyne, methyl ethyl ketone peroxide, cyclohexanone peroxide, lauroyl peroxide, azobisisobutyronitrile, and azobis(2,4-dimethylvaleronitrile).

15. The olefin-based ionomer resin composition of claim 12, wherein the radical initiator is used in an amount of 0.5 to 20 parts by weight based on 100 parts by weight of the first monomer and the second monomer.

16. The olefin-based ionomer resin composition of claim 1, further comprising one or more selected from the group consisting of a light stabilizer, a UV absorber, and a heat stabilizer.

17. An encapsulant for an optoelectronic device, comprising the olefin-based ionomer resin composition of claim 1.

18. The encapsulant for an optoelectronic device of claim 17, wherein a content of the second monomer is 0.5 to 10 parts by weight based on 100 parts by weight of a solid content in the olefin-based ionomer resin composition.

* * * * *